US011420557B2

(12) United States Patent
Hechtfischer et al.

(10) Patent No.: US 11,420,557 B2
(45) Date of Patent: Aug. 23, 2022

(54) LIGHT CONVERTING DEVICE WITH CONFINED LIGHT CONVERTER

(71) Applicant: LUMILEDS HOLDING B.V., Schiphol (NL)

(72) Inventors: Ulrich Hechtfischer, Aachen (DE); Florian Helling, Viersen (DE)

(73) Assignee: LUMILEDS, LLC, San Jose, CA (US)

( * ) Notice: Subject to any disclaimer, the term of this patent is extended or adjusted under 35 U.S.C. 154(b) by 0 days.

(21) Appl. No.: 16/276,984

(22) Filed: Feb. 15, 2019

(65) Prior Publication Data

US 2019/0257483 A1 Aug. 22, 2019

(30) Foreign Application Priority Data

Feb. 20, 2018 (EP) ..................................... 18157550

(51) Int. Cl.
*F21K 9/64* (2016.01)
*F21S 41/16* (2018.01)
(Continued)

(52) U.S. Cl.
CPC .......... *B60Q 11/005* (2013.01); *B60Q 1/0023* (2013.01); *F21K 9/64* (2016.08);
(Continued)

(58) Field of Classification Search
CPC .......... B60Q 1/0023; F21K 9/64; F21S 41/16; F21S 41/32; F21V 29/507; F21V 9/30;
(Continued)

(56) References Cited

U.S. PATENT DOCUMENTS 10,680,143 B2 6/2020 Takano et al.
2004/0076106 A1* 4/2004 Yamamoto ............. G11B 7/121
369/112.1
(Continued)

FOREIGN PATENT DOCUMENTS

EP 1734302 12/2006
EP 2975318 1/2016
(Continued)

OTHER PUBLICATIONS

International Search Report dated Jun. 6, 2019 for PCT International Application No. PCT/EP2019/053420.
(Continued)

*Primary Examiner* — Tsion Tumebo
(74) *Attorney, Agent, or Firm* — Volpe Koenig

(57) ABSTRACT

A light converting device comprising: a light converter with a light entrance surface and a light emission surface, wherein the light converter is arranged to convert laser light scanned over the light entrance surface to converted light, wherein a peak emission wavelength of the converted light is in a longer wavelength range than a laser peak emission wavelength of the laser light, a confinement structure enclosing the light converter, wherein the confinement structure is arranged to preserve a geometric shape of the light converter in case of a mechanical failure of the light converter. A laser-based light source comprising such a light converting device and a vehicle headlight comprising such a laser-based light source.

20 Claims, 8 Drawing Sheets

(51) Int. Cl.
  *F21S 41/32* (2018.01)
  *B60Q 1/00* (2006.01)
  *F21S 41/176* (2018.01)
  *F21S 41/19* (2018.01)
  *H01S 5/323* (2006.01)
  *F21V 25/02* (2006.01)
  *H01S 5/40* (2006.01)
  *H01S 5/00* (2006.01)
  *F21Y 115/30* (2016.01)
  *B60Q 11/00* (2006.01)

(52) U.S. Cl.
  CPC ............. *F21S 41/16* (2018.01); *F21S 41/176* (2018.01); *F21S 41/192* (2018.01); *F21S 41/32* (2018.01); *F21V 25/02* (2013.01); *H01S 5/0087* (2021.01); *H01S 5/32341* (2013.01); *H01S 5/40* (2013.01); *F21Y 2115/30* (2016.08)

(58) Field of Classification Search
  CPC .......... F21V 17/00; F21V 25/00; F21V 25/02; F21Y 2115/30
  See application file for complete search history.

(56) References Cited

U.S. PATENT DOCUMENTS

| | | | |
|---|---|---|---|
| 2009/0001399 A1 | 1/2009 | Diana et al. | |
| 2013/0092969 A1 | 4/2013 | Hikmet et al. | |
| 2014/0168942 A1* | 6/2014 | Kishimoto | F21S 41/176 362/84 |
| 2014/0353702 A1 | 12/2014 | Nagao et al. | |
| 2015/0085262 A1* | 3/2015 | Ogura | F21V 25/02 353/85 |
| 2015/0115304 A1* | 4/2015 | Singer | H01L 33/644 257/98 |
| 2016/0091171 A1* | 3/2016 | Okada | F21V 13/08 372/44.01 |
| 2016/0116123 A1 | 4/2016 | Yamanaka et al. | |
| 2016/0223158 A1* | 8/2016 | Park | F21V 7/0041 |
| 2016/0305626 A1* | 10/2016 | Tatara | F21S 41/16 |
| 2016/0312978 A1* | 10/2016 | Park | F21S 41/176 |
| 2016/0348857 A1* | 12/2016 | Miyata | F21V 9/45 |
| 2016/0369954 A1* | 12/2016 | Anc | B32B 7/04 |
| 2017/0051884 A1* | 2/2017 | Raring | H01S 5/02469 |
| 2017/0051892 A1* | 2/2017 | Blees | C09K 11/00 |
| 2017/0063032 A1* | 3/2017 | Morizumi | H01S 5/0087 |
| 2017/0276299 A1* | 9/2017 | Yamashita | H01S 5/0087 |
| 2017/0305330 A1 | 10/2017 | Park | |
| 2017/0345984 A1* | 11/2017 | Yamashita | H01L 33/644 |
| 2017/0356794 A1* | 12/2017 | Faivre | F21S 45/70 |
| 2018/0058642 A1* | 3/2018 | Shibata | F21K 9/64 |
| 2018/0094788 A1* | 4/2018 | Tokida | H01S 5/0087 |
| 2018/0115137 A1* | 4/2018 | Sorg | H01S 5/0092 |
| 2018/0323352 A1* | 11/2018 | Takano | H01L 33/502 |

FOREIGN PATENT DOCUMENTS

| | | |
|---|---|---|
| EP | 3018004 | 5/2016 |
| WO | 2010/049875 | 5/2010 |
| WO | 2015/197832 | 12/2015 |
| WO | 2017/207347 | 12/2017 |

OTHER PUBLICATIONS

International Preliminary Report on Patentability dated Aug. 27, 2020 for PCT International Application No. PCT/EP2019/053420.

* cited by examiner

LIGHT CONVERTING DEVICE WITH CONFINED LIGHT CONVERTER

FIELD OF INVENTION

The invention relates to a light converting device with a confined light converter, a laser-based light source comprising such a light converting device, and a vehicle headlight comprising such a laser-based light source.

BACKGROUND

In high luminance light sources often a light-converting device is used that is excited by e.g. blue light emitted by a laser. A phosphor of the light converting device is adhered to a heatsink by means of a layer of glue or solder which is provided between the heatsink and the phosphor. The high intensity especially of blue laser light and the high temperature caused by the light conversion by means of the phosphor may cause reliability and safety issues.

SUMMARY

It is an object of the present invention to provide a light converting device with improved reliability.

According to a first aspect a light converting device is provided. The light converting device comprises a light converter with a light entrance surface and a light emission surface. The light converter is arranged to convert laser light to converted light. A peak emission wavelength of the converted light is in a longer wavelength range than a laser peak emission wavelength of the laser light. The light converting device further comprises a confinement structure enclosing the light converter. The confinement structure is arranged to preserve a geometric shape of the light converter in case of a mechanical failure of the light converter such that eye safety of the light converting device is increased.

Laser-based (white light) sources are currently under investigation for vehicle and especially automotive headlights because of their high luminance of about 1 Gcd/m². In such laser-based light sources, an intense blue pump laser beam is sent to a light converter ("phosphor") that converts it to white light, which consists of about 75% (yellow) converted light and 25% (scattered) unconverted laser light. A well-known issue of such light sources is laser safety. If, in case of failure, the pump laser beam leaves the laser-based light source unscattered it can cause eye injuries. Therefore, the integrity of the converter must be ensured.

Ensuring the integrity of the light converter is most challenging, not for small converters (<1 mm²) in static sources, but for large converters (~1 cm²) of laser-scanner systems, where the pump laser beam is scanned over the light converter by a micro-mirror.

The confinement structure confines or encloses the light converter such that even a material defect of the converter material which may cause the light converter to go to pieces during operation (e.g. caused by the thermal load during light conversion) does not endanger the integrity of the light converter with respect to eye safety. The geometric shape of the light converter is essentially preserved. Integrity of the light converting device may be determined by reference measurements after enclosing the light converter in the confinement structure. It may for optical reasons not be desirable to embed the light converter in the confinement structure such that there is an optical interface between the light converter and the material of the confinement structure (see below).

The light converter may be further arranged to convert collimated laser light to converted light such that an intensity of unconverted laser light emitted by a surface element of the light emission surface with a size of 10000 μm² is less than a defined percentage of the intensity of the collimated laser light across the light emission surface when an emission direction of the collimated laser light is perpendicular to the light entrance surface of the light converter. The confinement structure is arranged to confine the light converter within the confinement structure such that the intensity of the unconverted laser light emitted by the surface element of the light emission surface with the size of 10000 μm² stays below the defined percentage plus 10%, more preferably below the defined percentage plus 5% of the intensity of the collimated laser light in case of the mechanical failure of the light converter.

The light converting device may for example be arranged such that a defined percentage of 25% of unconverted laser light is emitted by the light emission surface in accordance with the example described above. The percentage depends on the intended color point and the converter material of the light converter. The defined percentage may be in a range between 18% and 32%, preferably between 20% and 30% and most preferably between 22% and 28%. The light converter is confined by the confinement structure such that relative movements of pieces of the light converter are limited. The intensity of unconverted laser light which is emitted by the reference surface of 10000 μm² which comprises for example a crack between two pieces of the light converter because of relative movements between the two pieces is below 35%, preferably below 30%.

The light converter may be characterized by a thickness d perpendicular to the light entrance surface. The confinement structure is arranged to keep a broken piece of the light converter with the thickness d perpendicular to the light entrance surface at a position of the mechanical failure of the light converter.

The geometric boundary conditions imposed by the confinement structure which are necessary to guarantee eye safety even in case of a fatal failure of the light converter may depend on size, thickness and shape of the light converter (e.g. rectangular or circular). The confinement structure may therefore be arranged such that the broken piece of material of the light converter is kept close to its original position in the unimpaired light converter. The thickness d may usually be between 20 μm and 100 μm.

The confinement structure may for example be arranged to limit lateral shifts of the broken piece parallel to the light entrance surface relative to the original position of the broken piece within the light converter to less than 3 μm, preferably less than 2 μm, most preferably less than 1 μm. Avoiding or at least limiting lateral shifts reduces maximum possible size of cracks or slots in the light converter through which unconverted laser light which is not scattered by the light converter can reach subsequent optical devices and finally the eye of a person.

The confinement structure may be arranged such that there is a gap between the confinement structure and the light entrance surface or between the confinement structure and the light emission surface. A width of the gap perpendicular to the light entrance surface or the light emission surface may be less than 2 μm, preferably less than 1 μm and most preferably less than 0.5 μm. The gap may enable optical decoupling between surfaces of the light converter and neighboring surfaces of the confinement structure to reduce optical losses. The gap may for example be arranged such that there is a mechanical contact but no optical contact between the confinement structure and the light entrance surface or between the confinement structure and the light emission surface. No optical contact or essentially no optical contact means that there are at least micro-gaps between the confinement structure and the respective surface of the light converter. There may be a mechanical contact but a surface roughness of the corresponding surfaces of the confinement structure or the light converter avoids that there is a smooth interface between the material of the light converter and the confinement structure which might simultaneously act as on optical device of the laser-based light source.

The confinement structure may comprise a substrate and a confinement cover. The light converter is confined between the substrate and the confinement cover. Confining the light converter between at least two separate parts may simplify mechanical and optical construction of the light converting device. The confinement cover may for example comprise an optical element as a lens or the like for optical manipulation of the converted light and the unconverted laser light. The optical element may be integrated in the optical arrangement of the laser-based light source and especially in the optical arrangement of a vehicle headlight. The optical arrangement may be arranged to image the converted light and the unconverted laser light to an image plane that may be arranged in a distance of several meters.

The substrate may according to one embodiment be transparent at least in the wavelength range comprising the laser peak emission wavelength. The light entrance surface may be arranged next to the substrate. The light emission surface is in this embodiment different from the light entrance surface. The light emission surface is arranged next to a surface of the confinement cover. Light entrance surface and light emission surface are separated in this transmissive approach. The laser light enters the light converter via the light entrance surface, which borders the substrate, and converted light and unconverted laser light leaves the light emission surface usually after one passage through the light converter. The light entrance surface and the light emission surface are usually parallel to each other.

The substrate may be in mechanical contact but not in optical contact to the light entrance surface as discussed above. Optical contact between the light entrance surface and the substrate may increase optical losses because back reflection of converted light and especially unconverted laser light to the substrate may increase. The light entrance surface may optionally be covered by a mirror layer that is reflective in the wavelength range of the converted light but transmissive in the wavelength range of the laser light.

The optical element may alternatively or in addition be in mechanical contact but not in optical contact to the light emission surface. The relatively high refractive index of the optical element in comparison to air may increase the emitted numerical aperture of the light converter in case of an optical contact between the light converter and the optical element comprised by the confinement structure. Therefore, in case of an optical contact, in order to avoid optical losses, a higher numerical aperture of the optical element would be needed. Avoiding such optical contact therefore enables an efficient (no optical losses) and cost effective laser-based light source (reduced requirements with respect to numerical aperture of the optical device).

The substrate may according to an alternative embodiment of the light converting device be coupled to a reflective structure. The reflective structure is arranged to reflect laser light received via the light entrance surface of the light converter and converted light. The light entrance surface may be at least partly identical with the light emission surface. The light converting device is in this embodiment arranged according to the so-called reflective approach. A part of the converted light and the unconverted laser light may pass the light converter at least two times. The confinement structure may provide in such reflective setup, in contrast to the transmissive approach, only a part of the solution because the integrity of the light converter is not sufficient. The pump laser light could still be deflected out of the source, due to e.g. shifted pump optics (e.g. lens arranged to focus the laser light on the light converter) or due to reflecting particles on the light converter.

The light converting device according to any embodiment described above may comprise a failure sensor. The failure sensor is arranged to detect a damage of the confinement structure. The failure sensor may for example be arranged to detect a change of electrical resistance, capacitance or temperature in case of a mechanical damage of the confinement structure. The confinement structure may for example consist of, in comparison to the light converter, robust transparent materials like glasses in or on which metal wires or faces can be easily provided.

The failure sensor may for example be arranged to detect a relative movement of the confinement cover with respect to the substrate. The failure sensor may be arranged to detect relative movements of all sub elements or substructures of the confinement structure to determine potential damages of the confinement structure and/or the light converter which may be a risk with respect to eye safety. The failure sensor may have the advantage that essentially all potential damages of the light converting device can be detected without imposing restrictions with respect to light emission.

According to a further aspect, a laser-based light source is provided. The laser based light source comprises a light converting device as described above and at least one laser which is adapted to emit the laser light.

The laser-based light source may comprise two, three, four or more lasers (e.g. arranged as an array) emitting for example blue laser light.

The laser-based light source may further comprise a failure detector. The failure detector is coupled with the failure sensor described above. The failure detector is arranged to generate a control signal upon detection of the damage of the confinement structure. The laser-based light source is arranged to switch off the at least one laser upon detection of the control signal during operation of the laser-based light source.

According to a further aspect, a vehicle headlight is provided. The vehicle headlight comprises at least one laser-based light source as described above. The vehicle headlight may comprise two, three, four or more laser-based light sources as described above. The light converter may in this case comprise or consist of a yellow phosphor garnet (e.g. $Y_{(3-0.4)}Gd_{0.4},Al_5O_{12}:Ce$). A mixture of blue laser light and yellow converted light may be used to generate white light as described above.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIG. 1 shows a principal sketch of a prior art laser-based light source

Figure 2:
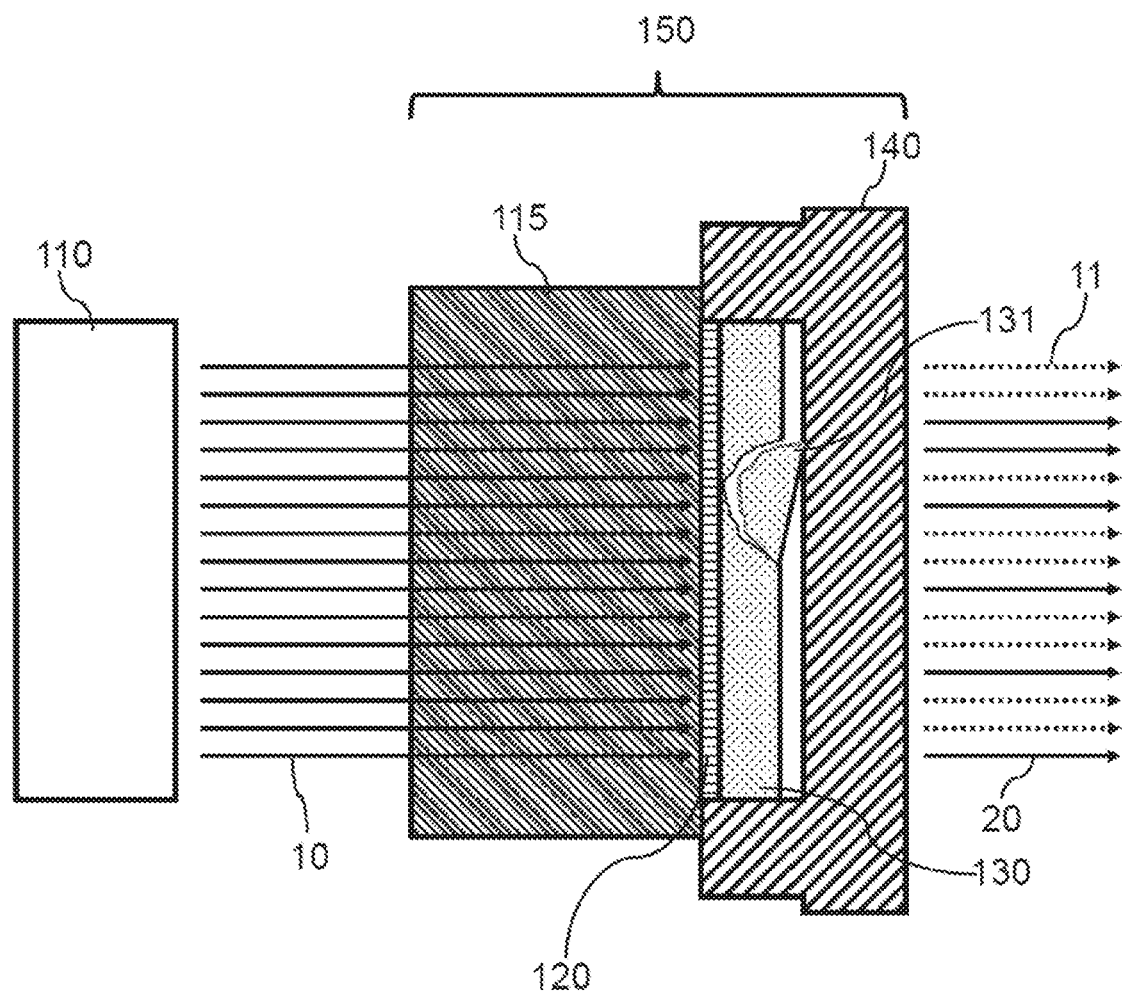
Figure 3:
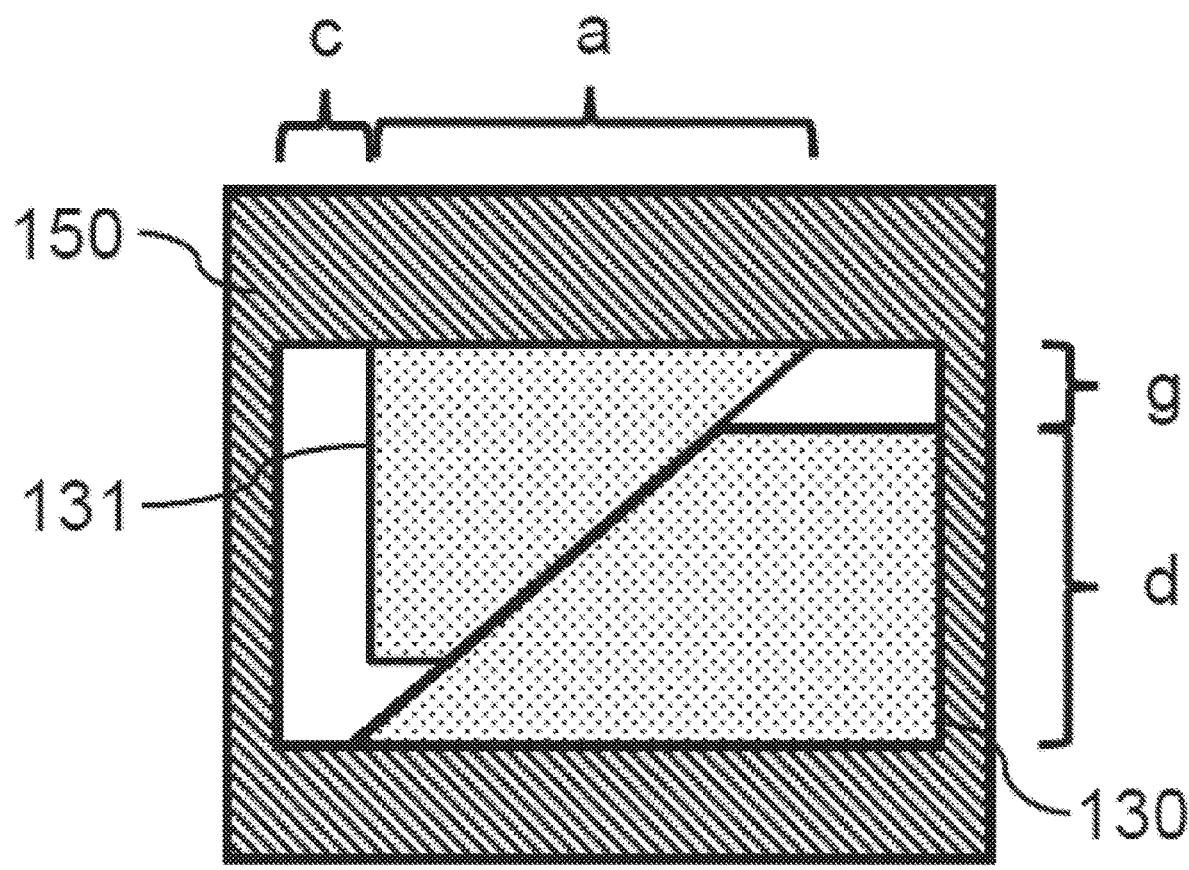
Figure 4:
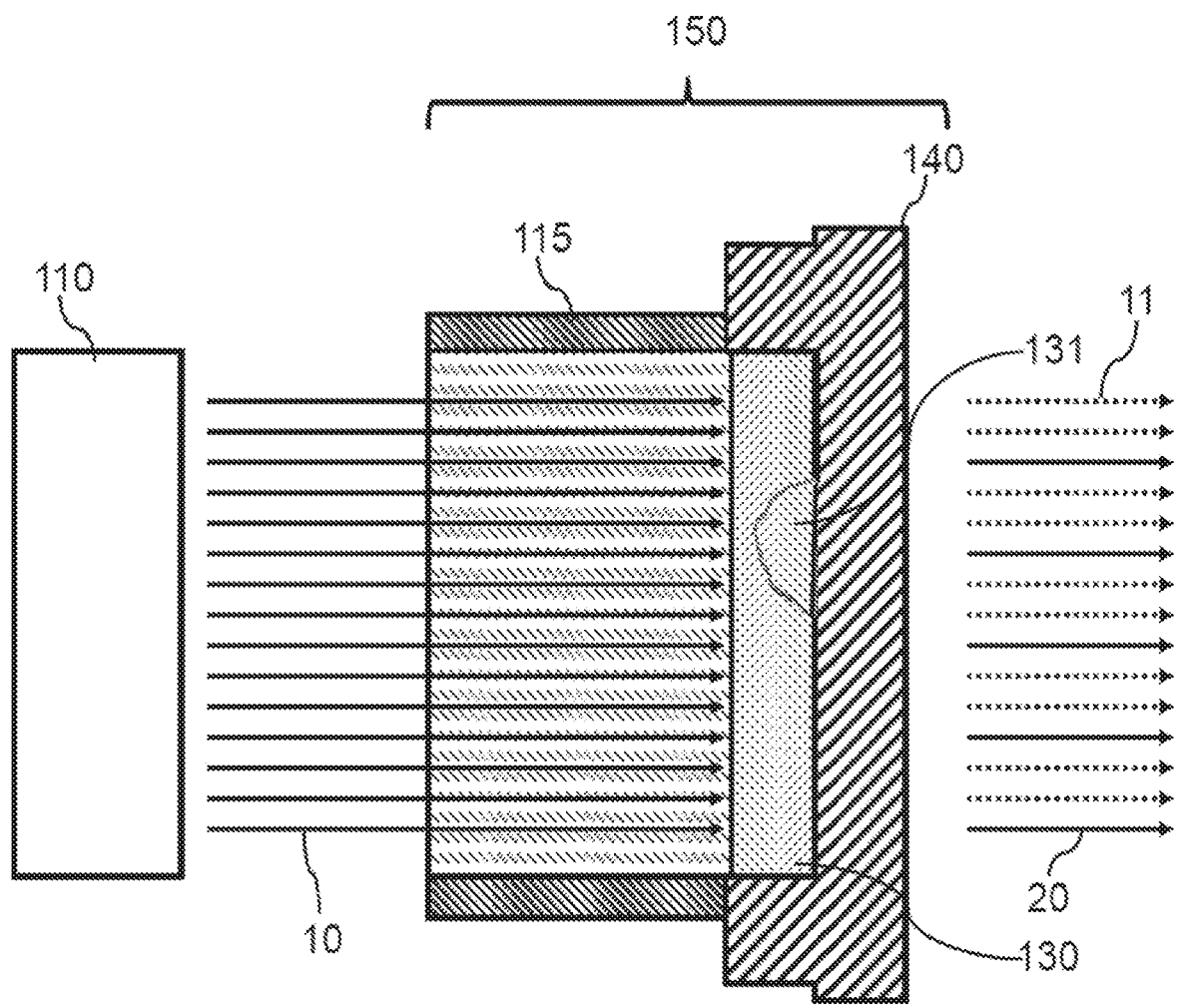
Figure 5:
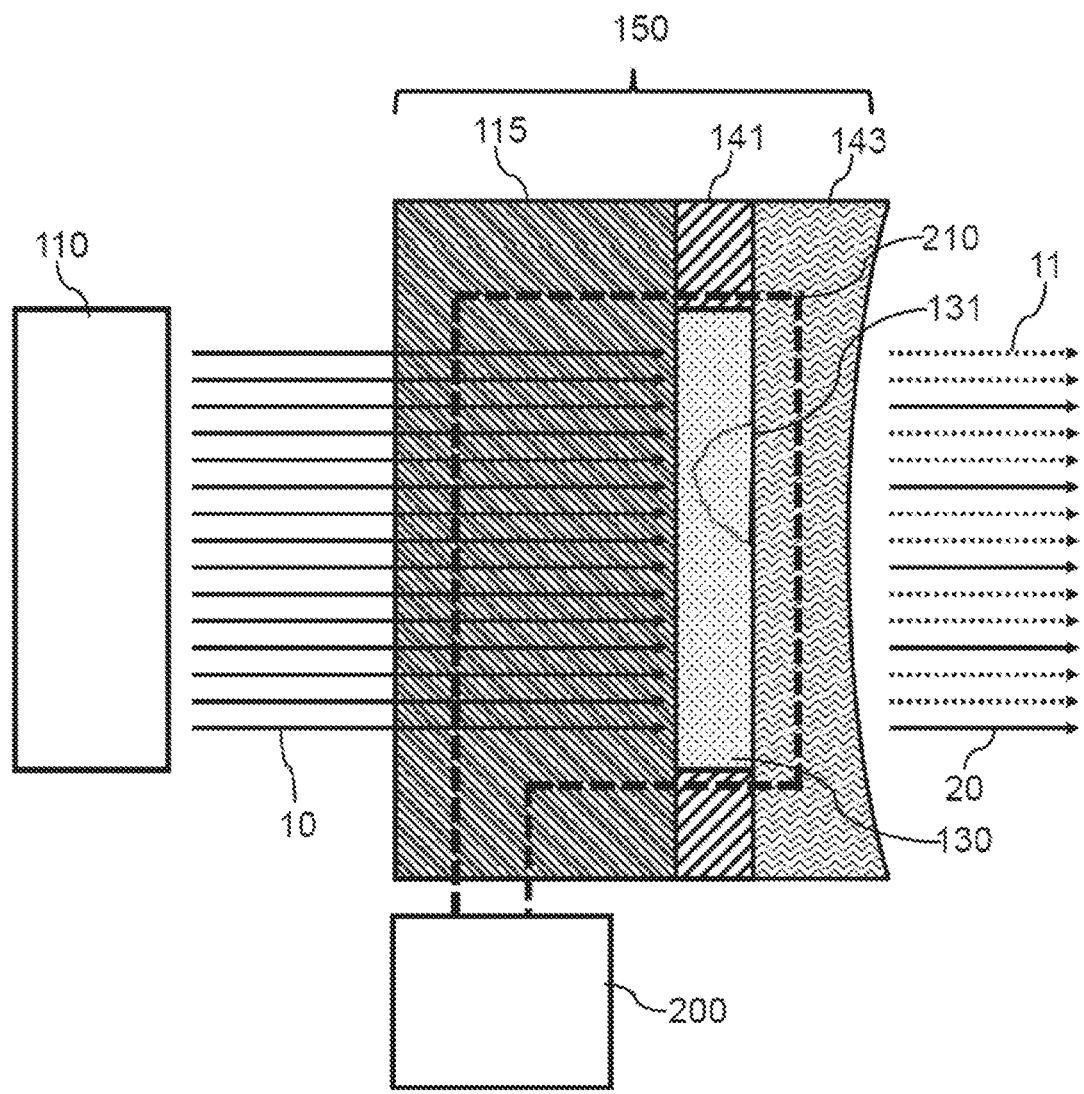
Figure 6:
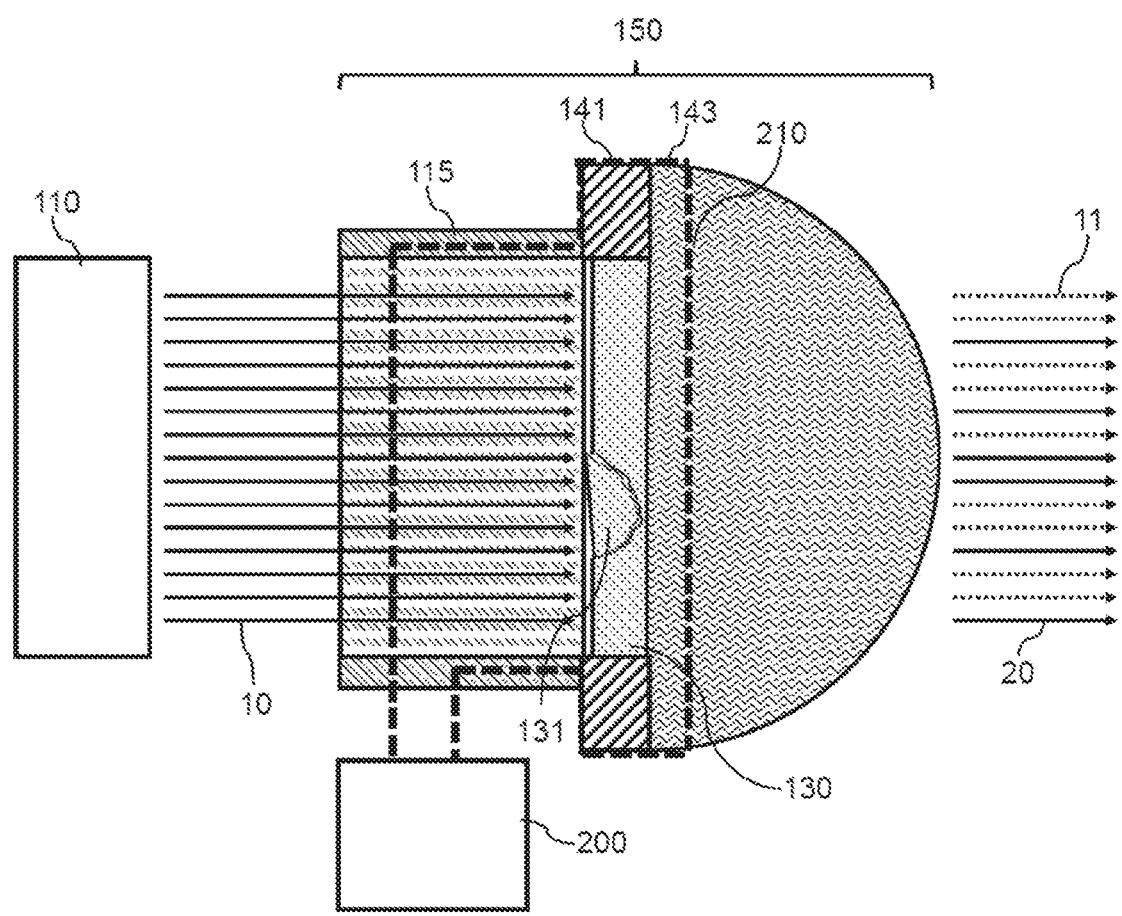
Figure 7:
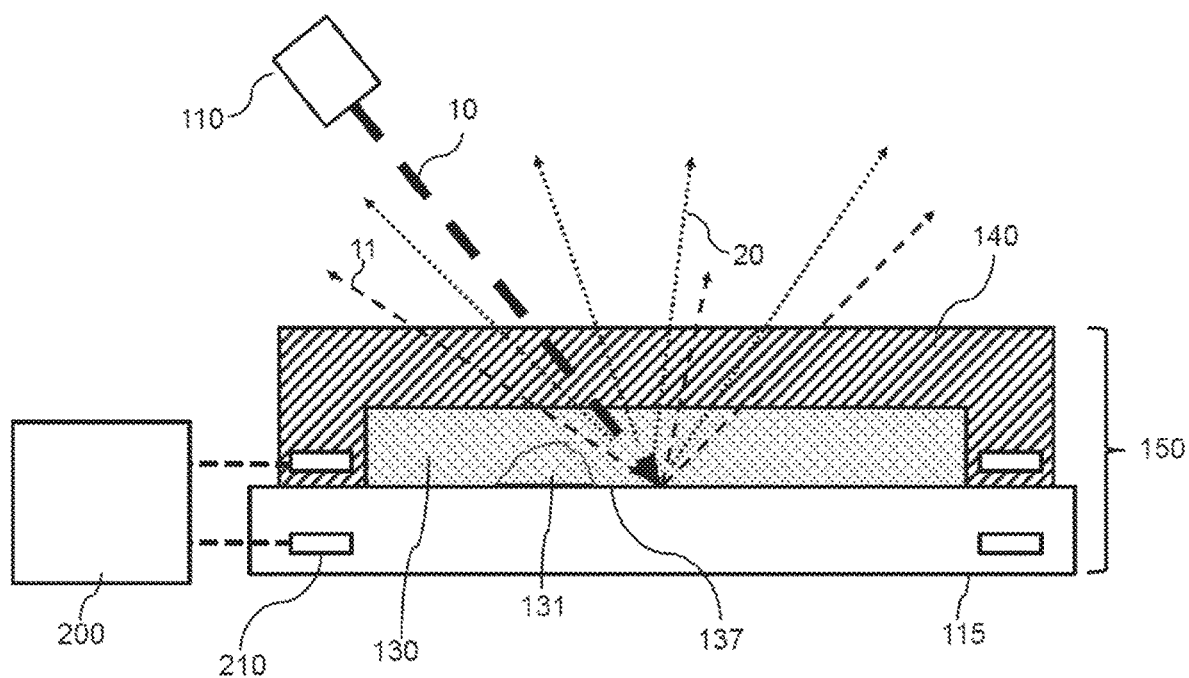
Figure 8:
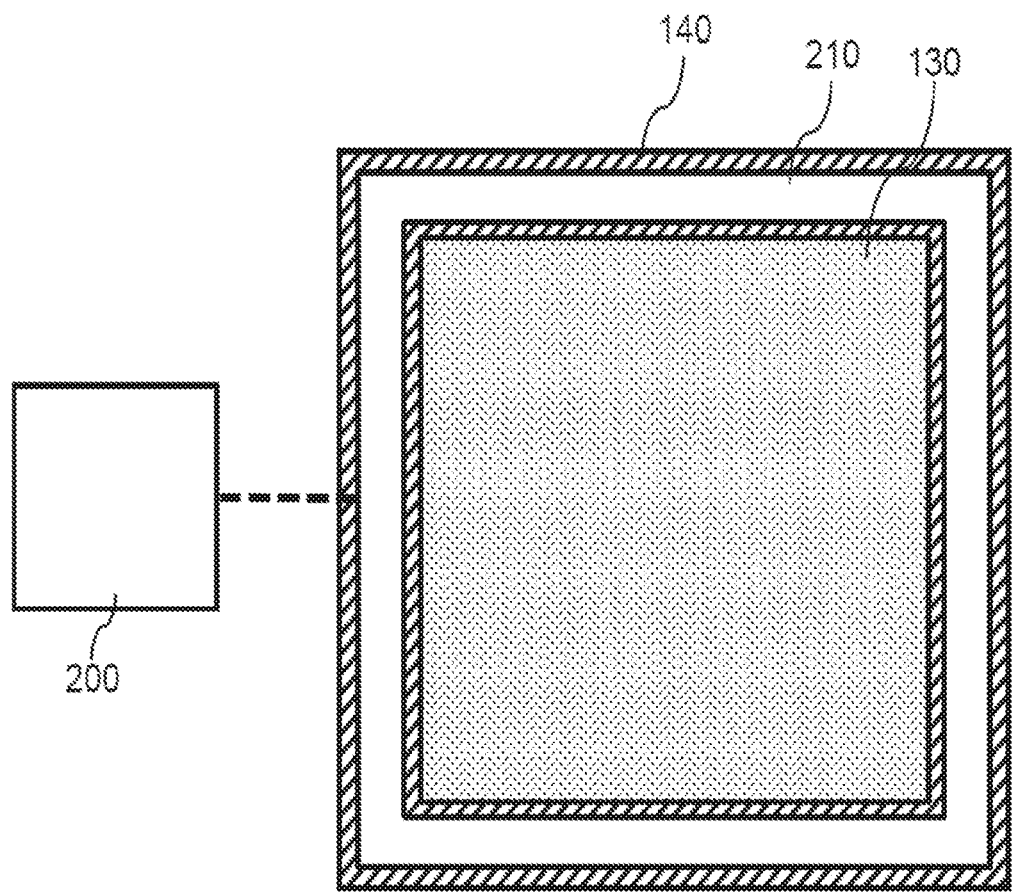

FIG. 2 shows a principal sketch of a first laser-based light source comprising a light converting device according to a first embodiment FIG. 3 shows a principal sketch of a mechanical failure of a light converter FIG. 4 shows a principal sketch of a second laser-based light source comprising a light converting device according to a second embodiment FIG. 5 shows a principal sketch of a third laser-based light source comprising a light converting device according to a third embodiment FIG. 6 shows a principal sketch of a fourth laser-based light source comprising a light converting device according to a fourth embodiment FIG. 7 shows a principal sketch of a fifth laser-based light source comprising a light converting device according to a fifth embodiment FIG. 8 shows a principal sketch of a top view of the light converting device according to the fifth embodiment In the Figures, like numbers refer to like objects throughout. Objects in the Figures are not necessarily drawn to scale.

DETAILED DESCRIPTION OF THE PREFERRED EMBODIMENTS

Various embodiments of the invention will now be described by means of the Figures.

Figure 1:
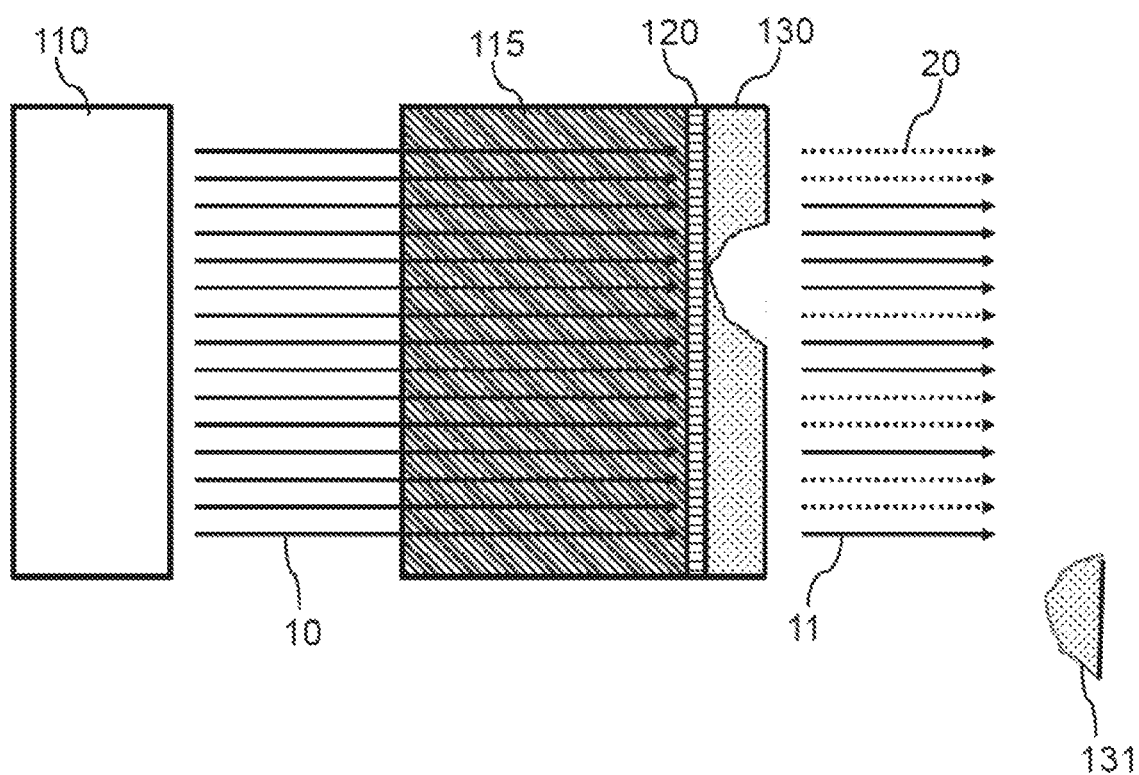

FIG. 1 shows a principal sketch of a prior art laser-based light source with a failure of the light converter 130. Laser light 10 is emitted by means of laser 110 to a light converter 130 in a transmissive arrangement. The light converter 130 is glued by means of a coupling layer 120 (e.g. silicone glue) with the light entrance surface to a transparent substrate 115. A piece 131 of the light converter 130 is broken out such that the intensity of unconverted laser light 11 is locally increased in comparison to converted light 20. Such a failure may in an extreme case result in transmission of a collimated beam of laser light 10 through the light converter 130. The increased intensity of unconverted laser light 11 may be inacceptable with respect to eye safety regulations.

FIG. 2 shows a principal sketch of a first laser-based light source comprising a laser 110 and a light converting device according to a first embodiment. The light converting device comprises a light converter 130 that is confined by means of a confinement structure 150. The confinement structure 150 comprises a transparent substrate 115 and a confinement cover 140. Laser light 10 is emitted by the laser 110 through the transparent substrate 115 and enters the light converter via a light entrance surface. The light converter 130 is attached to the transparent substrate 115 by means of a coupling layer 120 (e.g. silicone glue). The confinement cover 140 comprises a transparent material such that converted light 11 and unconverted laser light 20 can be transmitted through the confinement cover 140 to subsequent optical devices (not shown). The confinement cover 140 is attached to the substrate 115 such that the side surfaces of the for example rectangular light converter 130 are tightly surrounded by the confinement cover 140. The side surfaces of the light converter 130 are in mechanical contact with the confinement cover 140. A small gap is provided between a light emission surface of the light converter 130 and the confinement cover 140. The small gap may prevent optical contact between the light converter 130 and the confinement cover 140 to reduce optical losses (back reflection of light, e.g. due to total internal reflection, to the light converter 130). A surface of the confinement cover 140 through which the converted light 11 and the unconverted laser light 20 leave the confinement structure 150 may be covered with an antireflective coating. The size of the gap is exaggerated in FIG. 2 for clarity reasons. A width of the gap perpendicular to the light emission surface of the light converter 130 may be 0.5 μm. The size of the gap is that small that a broken piece 131 of the light converter 130 is confined nearly at its original position in the light converter 130. A local intensity of unconverted laser light 20 therefore increases only slightly without exceeding safety limits.

FIG. 3 shows a principal sketch of a mechanical failure of a light converter 130. The example shows a worst-case scenario in which the light converter 130 breaks in two parts such that a broken part 131 shifts laterally in comparison to the original position within the light converter 130. The light converter 130 is characterized by a rectangular shape with a width in the plane of FIG. 3 of L (e.g. between 100 μm and 2000 μm) and a thickness d (e.g. 50 μm). The light converter 130 platelet is enclosed by a transparent confinement structure 150. A light entrance surface of the light converter 130 is attached to the confinement structure 150. A gap with a width g is provided between the light emission surface of the light converter 130 and the confinement structure 150. A thickness of the broken piece 131 is the same as the thickness d of the light converter 130. The lateral shift of the at one side triangular shaped broken piece 131 results in a slot with a width c which enables transmission of unconverted laser light (not shown) through the light converting device. The lateral extension of the triangle of the broken piece 131 in the plane of FIG. 3 is given by a. Resulting in a maximum width $c=a_{max}*g/d$ wherein the maximum lateral extension of the broken piece 131 is given by $a_{max}=L-2*c$. The shape of the spot of laser light received by the light entrance surface is usually rectangular (imaged exit facet of a laser diode) and strongly magnified. The size of the spot on the light entrance surface may for example be 500×50 μm². Total optical power of the spot may be 3 W. The laser spot may be in the worst-case scenario static (no scanning). The width of the slot may be c=3 μm. This would result in a total optical power emitted by the slot of 18 mW or 180 mW depending on the relative position of the rectangular spot with respect to the slot neglecting any optical diffraction at the slot, which would increase divergence of the laser beam. The additional divergence due to optical diffraction at the slot would be 7.5° (diffraction of a plane wave at the slot with a width of 3 μm). The additional divergence may be sufficient to reduce the intensity to an acceptable level at relevant distances (e.g. 5 m). The intensity at the relevant distance further depends on the subsequent optical arrangement of the laser-based light source. The whole optical arrangement has thus to be analyzed to determine the correct geometric boundary conditions imposed by the confinement structure 150.

The worst-case scenario is very unlikely. It is for example unlikely that the usually polycrystalline material of the light converter (e.g. ceramic phosphor material) breaks in the way described in FIG. 3. The laser light is therefore usually further deflected because there is no such a straight slot as described in FIG. 3. The width of the gap g may therefore be broader in realistic scenarios in comparison to the scenario discussed with respect to FIG. 3 without substantial risk of eye injuries.

FIG. 4 shows a principal sketch of a second laser-based light source comprising a light converting device according to a second embodiment. The second embodiment is very similar to the first embodiment described with respect to FIG. 2. The light converter 130 is mechanically clamped between the transparent substrate 115 and the confinement cover 140. The transparent substrate 115 and the confinement cover 140 are bonded to each other such that the confinement cover 140 surrounds the light converter 130. The transparent substrate 115 is in this case a light guide guiding laser light 10 emitted by a laser 110 to the light converter 130. Roughness of the light entrance surface and the light emission surface of the light converter 130 is arranged such that there is a mechanical but essentially no optical contact to the light fiber and the confinement cover 140. Mechanical clamping by means of the light fiber and the confinement cover 140 essentially avoids any movement of a broken piece 131 of the light converter 130.

FIG. 5 shows a principal sketch of a third laser-based light source comprising a light converting device according to a third embodiment. The general configuration is again similar as described with respect to FIG. 2 and FIG. 4. The confinement structure 150 comprises in this embodiment a transparent substrate 115, a side confinement 141 and an optical element 143. An additional mechanical clamp (not shown) may be used to clamp the light converter 130 between the transparent substrate 115 and the optical element 143, wherein the side surfaces of the light converter 130 are surrounded by the side confinement 141 (e.g. ceramic or steel plate with a hole arranged in accordance with the shape and size of the light converter 130). The light converting device further comprises a failure sensor 210 here being a conductive track extending across the transparent substrate 115, the side confinement 141 and the optical element 143. The conductive track is coupled to a failure detector 200 of the laser-based light source which is arranged to detect (e.g. by detecting the electrical resistance) any defect of the conductive track which may be caused by relative movements between the transparent substrate 115, the side confinement 141 and the optical element 143. The conductive track may be arranged in a meandering pattern around the confinement structure 150 such that essentially each relative movement of the elements of the confinement structure 150 can be detected.

FIG. 6 shows a principal sketch of a fourth laser-based light source comprising a light converting device according to a fourth embodiment. The light converter 130 is confined by means of the confinement structure 150 comprising a transparent substrate 115 (light guide), a side confinement 141 similar as described with respect to FIG. 6 and an optical element 143. The light converter 130 is thermally or reactively bonded to the optical element 143, which is in this embodiment a light outcoupling dome (e.g. sapphire semi sphere). The side confinement is a metal plate that tightly fits to the lateral extension of the light converter 130. The light fiber and the side confinement 141 are arranged such that there is a small gap of 2 μm between the light fiber and the light converter 130. The small gap confines a broken piece 131 of the light converter 130 nearly at its original position within the light converter 130. A failure sensor 210 and a failure detector 200 are provided in a similar fashion as discussed with respect to FIG. 5 such that small relative movements between the light fiber, the side confinement 141 and the light outcoupling dome 143 can be detected. The failure sensor 210 may alternatively or in addition comprise thermocouples which are arranged near to the side confinement 141 to detect temperature changes during operation of the laser-based light source which may be caused by failures of the light converter 130 and/or the confinement structure 150.

FIG. 7 shows a principal sketch of a fifth laser-based light source comprising a light converting device according to a fifth embodiment. The fifth embodiment is a reflective arrangement in which a light entrance surface and a light emission surface of a light converter 130 are essentially the same. The light converter 130 is confined between a substrate 115 and a confinement cover 140. The substrate 115 comprises a reflective structure 137, which is arranged next to the light converter 130, such that unconverted laser light 11 and converted light 20 is reflected by means of the reflective structure 137. The confinement cover 140 of the confinement structure 150 is glued to the substrate 115 such that relative movements of a broken piece 131 of the light converter 130 are essentially inhibited. The laser-based light source further comprises a failure sensor 210 and a failure detector 200. The failure sensor 210 is arranged as a capacitor wherein one side of the capacitor is arranged around the light converter 130 within the confinement cover 140. The other side of the capacitor is arranged within the substrate 115. Both plates of the capacitor are aligned to each other as shown in FIG. 8 depicting a principal sketch of a top view of the light converting device according to the fifth embodiment. A displacement of the confinement cover 140 with respect to the substrate 115 would cause a change of the capacitance, which can be detected by failure detector 200.

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

LIST OF REFERENCE NUMERALS 10 laser light
11 unconverted laser light
20 converted light
110 laser
115 substrate, transparent structure
120 coupling layer
130 light converter
131 broken piece
137 reflective structure
140 confinement cover
141 side confinement
143 optical element
150 confinement structure 200 failure detector
210 failure sensor
a, $a_{max}$(maximal) lateral extension of broken piece
c width of slot provided by lateral shift of broken piece
d thickness of light converter
g width of gap between light emission surface of light converter and confinement structure
L lateral extension of light converter

What is claimed is:

1. A light converting device comprising:
    a light converter with a light entrance surface and a light emission surface, the light converter arranged to convert laser light scanned over the light entrance surface to converted light with a peak emission wavelength of the converted light in a longer wavelength range than a laser peak emission wavelength of the laser light, and
    a confinement structure having a geometric shape approximately matching the geometric shape of the light converter and defining a gap between the confinement structure and the light emission surface of the light converter, the confinement structure to surround and limit lateral shifts of the light converter and to preserve a geometric shape of the light converter in case of a mechanical failure of the light converter.

2. The light converting device according to claim 1, wherein the light converter is characterized by a thickness d perpendicular to the light entrance surface, wherein the confinement structure is arranged to keep a broken piece of the light converter with the thickness d perpendicular to the light entrance surface at a position of the mechanical failure of the light converter.

3. The light converting device according to claim 1, wherein the confinement structure is arranged such that there is a width g of a gap between the confinement structure and the light entrance surface or of the gap between the confinement structure and the light emission surface, wherein the width g of the gap perpendicular to the light entrance surface or the light emission surface is less than 2 μm.

4. The light converting device according to claim 3, wherein the gap is arranged such that there is a mechanical contact but no optical contact between the confinement structure and the light entrance surface or between the confinement structure and the light emission surface.

5. The light converting device according to claim 1, wherein the confinement structure comprises a substrate and a confinement cover, wherein the light converter is confined between the substrate and the confinement cover.

6. The light converting device according to claim 5, wherein the substrate is transparent in the wavelength range comprising the laser peak emission wavelength, wherein the light entrance surface is arranged next to the substrate, wherein the light emission surface is different from the light entrance surface, and wherein the light emission surface is arranged next to a surface of the confinement cover.

7. The light converting device according to claim 6, wherein the substrate is in mechanical contact but not in optical contact to the light entrance surface.

8. The light converting device according to claim 6, wherein the confinement cover is in mechanical contact but not in optical contact to the light emission surface.

9. The light converting device according to claim 5, wherein the substrate is coupled to a reflective structure, wherein the reflective structure is arranged to reflect laser light received via the light entrance surface of the light converter and converted light to the light emission surface.

10. The light converting device according to claim 1, comprising a failure sensor, wherein the failure sensor is arranged to detect a damage of the confinement structure.

11. The light converting device according to claim 10, wherein the confinement structure comprises a substrate and a confinement cover, wherein the light converter is confined between the substrate and the confinement cover, and wherein the failure sensor is arranged to detect a relative movement of the confinement cover with respect to the substrate.

12. A laser-based light source comprising:
    a light converting device according to claim 1, and
    a laser adapted to emit the laser light.

13. The laser-based light source according to claim 12,
    wherein the light converting device comprises a failure sensor, wherein the failure sensor is arranged to detect a damage of the confinement structure,
    wherein the confinement structure comprises a substrate and a confinement cover, wherein the light converter is confined between the substrate and the confinement cover, and wherein the failure sensor is arranged to detect a relative movement of the confinement cover with respect to the substrate,
    the laser-based light source further comprising a failure detector,
        wherein the failure detector is coupled with the failure sensor,
        wherein the failure detector is arranged to generate a control signal upon detection of the damage of the confinement structure, and
        wherein the laser-based light source is arranged to switch off the laser upon detection of the control signal during operation of the laser-based light source.

14. A vehicle headlight comprising a laser-based light source according to claim 12.

15. The light converting device of claim 1, wherein the confinement structure improves the safety of the light converting device.

16. The light converting device of claim 1, wherein the gap is less than 3 μm.

17. The light converting device of claim 1, wherein the gap is less than 2 μm.

18. The light converting device of claim 1, wherein the gap is less than 1 μm.

19. The light converting device of claim 1, wherein the gap comprises micro-gaps.

20. The light converting device of claim 1, wherein the gap creates optical decoupling between the light converter and the confinement structure.

* * * * *